(12) United States Patent
Kale et al.

(10) Patent No.: US 11,204,385 B2
(45) Date of Patent: Dec. 21, 2021

(54) TRANSITION FAULT TEST (TFT) CLOCK RECEIVER SYSTEM

(71) Applicant: TEXAS INSTRUMENTS INCORPORATED, Dallas, TX (US)

(72) Inventors: Gautam Sanjay Kale, Kundalahalli Colony (IN); Nagalinga Swamy B. Aremallapur, Ranebennur (IN); Sundarrajan Rangachari, Horamavu (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 7 days.

(21) Appl. No.: 16/863,906

(22) Filed: Apr. 30, 2020

(65) Prior Publication Data

US 2021/0148974 A1 May 20, 2021

(30) Foreign Application Priority Data

Nov. 20, 2019 (IN) .............................. 201941047256

(51) Int. Cl.
*G01R 31/3177* (2006.01)
*G06F 1/08* (2006.01)

(52) U.S. Cl.
CPC ............ *G01R 31/3177* (2013.01); *G06F 1/08* (2013.01)

(58) Field of Classification Search
CPC ............................... G01R 31/3177; G06F 1/08
See application file for complete search history.

(56) References Cited

U.S. PATENT DOCUMENTS

| 10,317,462 | B2 * | 6/2019 | Huang | ........................ H03L 7/23 |
| 2005/0055615 | A1 * | 3/2005 | Agashe | .......... G01R 31/318552 714/727 |
| 2005/0283695 | A1 * | 12/2005 | Warren | .......... G01R 31/318552 714/734 |
| 2007/0245191 | A1 * | 10/2007 | Ravikumar | .... G01R 31/318594 714/726 |
| 2011/0099442 | A1 * | 4/2011 | Hales | ............. G01R 31/318533 714/729 |

(Continued)

OTHER PUBLICATIONS

Zakaria, et al.: "Case Studies on Transition Fault Test Generation for At-Speed Scan Testing"; 2010 25th International Symposium on Defect and Fault Tolerance in VLSI Systems; found on the internet Apr. 22, 2020 at: https://ieeexplore.ieee.org/document/5634891.

*Primary Examiner* — Kyle Vallecillo
(74) *Attorney, Agent, or Firm* — John R. Pessetto; Charles A. Brill; Frank D. Cimino

(57) ABSTRACT

One example includes a clock receiver system. The system includes a scan clock generator configured to receive a shift clock signal and a high-speed clock signal and to generate a scan clock signal for a transition fault test (TFT) based on the high-speed clock signal. The scan clock generator can provide the scan clock signal as having a pulse sequence comprising at least one preliminary pulse followed by periodic logic state transitions in a capture window during the TFT. The system also includes receiver logic configured to receive the scan clock signal and being programmed to identify each of the at least one preliminary pulse and the periodic logic state transitions in the capture window to pass the TFT.

20 Claims, 3 Drawing Sheets

(56) References Cited

U.S. PATENT DOCUMENTS

| | | | | |
|---|---|---|---|---|
| 2011/0121838 A1* | 5/2011 | Gillis | ............. | G01R 31/318544 |
| | | | | 324/537 |
| 2012/0030532 A1* | 2/2012 | Jain | ................ | G01R 31/318547 |
| | | | | 714/726 |
| 2014/0281764 A1* | 9/2014 | Sugie | ................. | G11C 29/1201 |
| | | | | 714/718 |
| 2018/0038910 A1* | 2/2018 | Kawoosa | ........... | G01R 31/3177 |
| 2018/0307553 A1* | 10/2018 | Acharya | ............. | G06F 11/0757 |
| 2018/0307788 A1* | 10/2018 | Pradeep | .................. | G06F 30/30 |
| 2019/0339328 A1* | 11/2019 | Xiang | ............ | G01R 31/318335 |

\* cited by examiner

TRANSITION FAULT TEST (TFT) CLOCK RECEIVER SYSTEM

RELATED APPLICATIONS

This application claims priority from India Provisional Patent Application Serial No. 1/50059/2019-CHE, filed 20 Nov. 2019, which is incorporated herein in its entirety.

TECHNICAL FIELD

This disclosure relates generally to electronic systems, and more specifically to a transition fault test (TFT) clock receiver system.

BACKGROUND

Modern digital computing systems implement clock signals to provide timing functions for associated processors and processing functions. To ensure proper functionality of the clock signal and the processing components, a clock receiver, such as a local component on a processor or other chip, can perform any of a variety of tests to determine proper capture of a clock signal. One such test can be described as a transition fault test (TFT). In a TFT, a sequence of clock signal pulses can be provided to an associated clock receiver to determine if the clock receiver correctly identifies that the clock pulses were provided. As an example, in the TFT, the clock receiver attempts to identify a predetermined sequence of logic transitions of the clock signal. Such tests can be particularly important as clock speeds increase into the GHz range of frequencies. However, as clock frequencies increase, clock signal generators can sometimes experience clock instability, such as resulting in missing pulses or insufficient amplitude of some of the initial pulses of the clock signal. Such instability can result in failure of the TFT.

SUMMARY

One example includes a clock receiver system. The system includes a scan clock generator configured to receive a shift clock signal and a high-speed clock signal and to generate a scan clock signal for a transition fault test (TFT) based on the high-speed clock signal. The scan clock generator can provide the scan clock signal as having a pulse sequence comprising at least one preliminary pulse followed by periodic logic state transitions in a capture window during the TFT. The system also includes receiver logic configured to receive the scan clock signal and being programmed to identify each of the at least one preliminary pulse and the periodic logic state transitions in the capture window to pass the TFT.

Another example includes a method for performing a launch off capture (LOC) TFT. The method includes providing a shift clock signal and a high-speed clock signal to a scan clock generator. The method also includes providing a scan enable signal to the scan clock generator and to receiver logic to switch from a shift-in phase to a capture window. The method also includes generating a scan clock signal based on the high-speed clock signal. The scan clock signal includes a pulse sequence comprising at least one preliminary pulse followed by periodic pulses in the capture window. The method further includes identifying each of the at least one preliminary pulse and the periodic pulses in the capture window via the receiver logic to pass the TFT.

Another example includes an integrated circuit (IC) chip that includes a clock receiver system. The system includes a scan clock generator configured to receive a shift clock signal and a high-speed clock signal and to generate a scan clock signal for a launch off capture (LOC) transition fault test (TFT) based on the high-speed clock signal. The scan clock generator can provide the scan clock signal as having a pulse sequence comprising at least one preliminary pulse followed by periodic pulses in a capture window during the TFT. Each of the at least one preliminary pulse can include a pulse width that is greater than a pulse width of each of the periodic pulses. The system also includes receiver logic configured to receive the scan clock signal and being programmed to identify each of the at least one preliminary pulse and the periodic pulses in the capture window to pass the TFT

DETAILED DESCRIPTION

This disclosure relates generally to electronic systems, and more specifically to a transition fault test (TFT) clock receiver system. The clock receiver system includes a scan clock generator configured to generate a scan clock signal in response to a shift clock signal, a high-speed clock signal, and a scan enable signal. As an example, the high-speed clock signal can correspond to a high-frequency clock signal that is implemented for timing functions and data capture in an integrated circuit (IC) chip in an associated computer system. The clock receiver system includes, for example, at least one pulse generator configured to generate a sequence of pulses that are provided in the scan clock during an associated TFT. For example, the TFT can be implemented as a launch off capture (LOC) TFT, such that the sequence of pulses includes a launch pulse followed by a capture pulse that each have pulse widths that are approximately equal to a pulse width of the high-speed clock signal. As an example, the TFT can be performed at any stage of fabrication and/or operation of the associated circuit, such as during a wafer test, a probe test, a package test, a bench test, and/or at startup of the associated circuit.

The scan clock generator can provide the scan clock signal as also including at least one preliminary pulse that is followed by periodic pulses (e.g., the launch pulse and the capture pulse). For example, the at least one preliminary pulse can each have a pulse width that is greater than a pulse width of each of the periodic pulses. As an example, the at least one preliminary pulse can include a first preliminary pulse that has a pulse-width that is at least twice the pulse width of each of the periodic pulses and a second preliminary pulse that has a pulse-width that is greater than a pulse width of each of the periodic pulses (e.g., one and one-half pulse-widths). The clock receiver system can also include receiver logic that can be programmed to identify each pulse in the pulse sequence. Upon identifying each pulse in the pulse sequence, the clock receiver system can pass the TFT for operation of the associated circuit.

Figure 1:
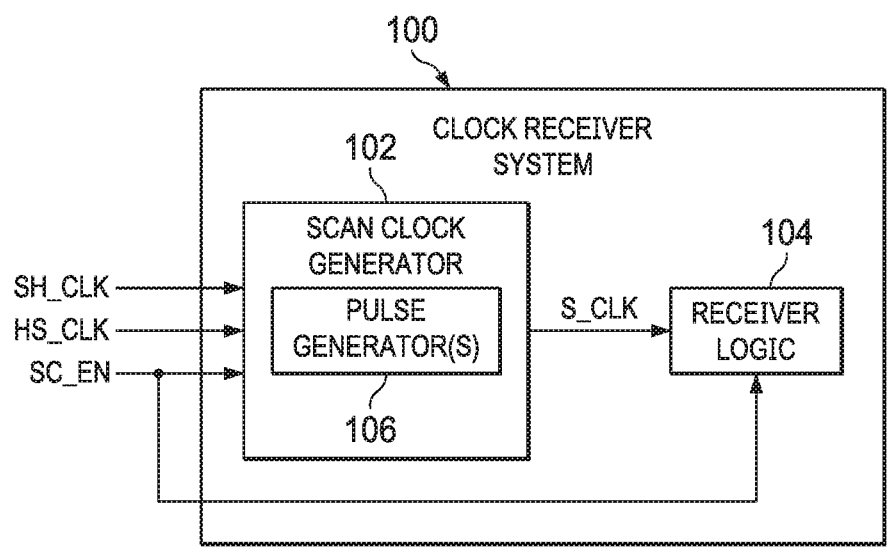
FIG. 1 illustrates an example of a clock receiver system.

FIG. 1 illustrates an example of a clock receiver system 100. The clock receiver system 100 can be implemented in any of a variety of IC chips, such as a processor, application specific integrated circuit (ASIC), field programmable gate array (FPGA), or other type of circuit that requires a clock signal for data transfer and/or manipulation. As described herein, the clock receiver system 100 can be implemented for performing a TFT that substantially mitigates failure based on distortion of initial pulses of a clock signal.

The clock receiver system 100 includes a scan clock generator 102 and receiver logic 104. In the example of FIG. 1, the clock receiver system 100 can be implemented to perform the TFT in response to receiving a scan enable signal SC_EN that is provided to the scan clock generator 102 and the receiver logic 104. For example, the TFT can be initiated in response to a logic-state change of the scan enable signal SC_EN. In the example of FIG. 1, the scan clock generator 102 receives a shift clock signal SH_CLK and a high-speed clock signal HS_CLK. As an example, the high-speed clock signal HS_CLK can correspond to a high-frequency clock signal that is implemented for timing functions and data capture for normal operation in the associated circuit. In response to receiving the shift clock signal SH_CLK and the high-speed clock signal HS_CLK, the scan clock generator 102 is configured to generate a scan clock signal S_CLK for use in the TFT.

In the example of FIG. 1, the clock receiver system 102 includes at least one pulse generator 106 configured to generate a sequence of pulses that are provided in the scan clock signal S_CLK during the associated TFT. As an example, the pulse sequence can be implemented during a capture window, such as defined by the scan enable signal SC_EN, and can include a sequence of periodic logic-state transitions, such as periodic pulses. For example, the TFT can be implemented as a launch off capture (LOC) TFT. Therefore, the sequence of pulses generated by the pulse generator(s) 106 can include a pair of pulses corresponding to a launch pulse followed by a capture pulse that each have pulse widths that are approximately equal to one pulse width of the high-speed clock signal HS_CLK, with a logic-low time between the launch and capture pulses likewise corresponding to one pulse-width of the high-speed clock signal HS_CLK. In addition, as described in greater detail herein, the sequence of pulses provided in the scan clock signal S_CLK, as generated by the pulse generator(s) 16, can also include at least one preliminary pulse that precedes the periodic pulses.

The receiver logic 104 can be programmed to identify each of the pulses in the pulse sequence provided in the scan clock signal S_CLK to pass the TFT. Therefore, the receiver logic 104, in response to the logic-state change of the scan enable signal SC_EN, is configured to identify each of the at least one preliminary pulse and each of the subsequent periodic pulses in the scan clock signal S_CLK. In response to identifying each of the at least one preliminary pulse and each of the subsequent periodic pulses, the receiver logic 104 can identify that the TFT is successful.

For example, the at least one preliminary pulse in the sequence of pulses provided in the scan clock signal S_CLK can each have a pulse width that is greater than a pulse width of each of the subsequent periodic pulses. As an example, the at least one preliminary pulse can include a first preliminary pulse that has a pulse-width that is at least twice the pulse width of each of the periodic pulses, and can include a second preliminary pulse that has a pulse-width that is greater than a pulse width of each of the periodic pulses (e.g., one and one-half pulse-widths).

Because the scan clock signal in typical clock receiver systems can exhibit distortion on the initial high-speed logic transitions (e.g., of a launch pulse and/or a capture pulse in a typical LOC TFT), receiver logic in a typical clock receiver system may be unable to detect the initial high-speed logic transitions of the scan clock signal due to insufficient amplitude of the logic-low to logic-high transitions. However, as a result of the increased pulse-width of the at least one preliminary pulse relative to the subsequent periodic pulses, the at least one preliminary pulse can substantially mitigate the deleterious effects of distortion on the logic-low to logic-high transition of the at least one preliminary pulse. In other words, the at least one preliminary pulse can be asserted at a logic-high state for a sufficient amount of time to allow for the receiver logic 104 to detect the at least one preliminary pulse, even when distorted. The initial clock distortion can thus settle subsequent to the at least one preliminary pulse, allowing the receiver logic 104 to detect the high-speed periodic logic state transitions of the subsequent periodic pulses at the frequency of the high-speed clock signal HS_CLK to therefore successfully pass the associated TFT.

Figure 2:
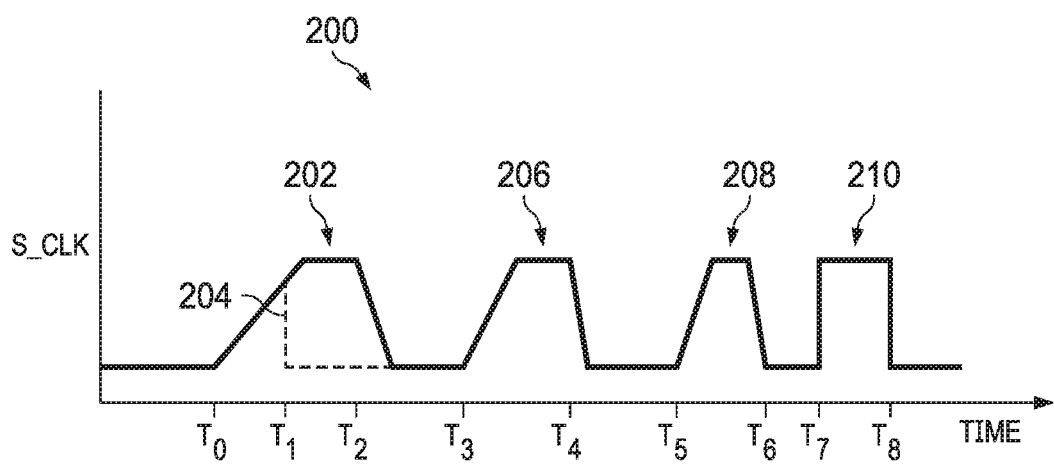
FIG. 2 illustrates an example of a timing diagram.

FIG. 2 illustrates an example of a timing diagram 200. The timing diagram 200 can correspond to a sequence of pulses of the scan clock signal S_CLK. The scan clock signal S_CLK can correspond to the scan clock scan enable signal S_CLK in the example of FIG. 1. Therefore, reference is to be made to the example of FIG. 1 in the following description of the example of FIG. 2.

The timing diagram 200 demonstrates an amplitude of the scan clock signal S_CLK plotted over time. At a time $T_0$, the scan clock signal S_CLK is asserted from a logic-low to a logic-high state corresponding to a rising-edge of a first preliminary pulse, demonstrated at 202. The timing diagram 200 demonstrates the effect of the distortion that can occur in an initial logic-high transition (e.g., based on properties of the associated fabrication materials, such as silicon (Si)) of the scan clock signal S_CLK. The distortion therefore provides for a slower transition from the logic-low state to the logic-high state.

In the example of FIG. 2, at a time $T_1$, a dotted line 204 demonstrates a logic-high to logic-low transition that would correspond to a logic-high to logic-low transition of a launch pulse in a typical clock receiver system that implements a LOC TFT. The dotted line 204 therefore represents a pulse width of the initial pulse (e.g., a launch pulse) of the scan clock signal S_CLK at the frequency of the high-speed clock signal HS_CLK. Due to the slower transition from the logic-low state to the logic-high state based on the distortion, if the initial pulse of the scan clock signal S_CLK was de-asserted before the amplitude of the initial pulse could achieve a sufficient amplitude for detection by the receiver logic 104 by a sufficient amount of time, the receiver logic 104 could fail to identify the logic-state transitions of the initial pulse (e.g., corresponding to the launch pulse) of the scan clock signal S_CLK. Therefore, if the distorted initial pulse was provided at the frequency of the high-speed clock signal HS_CLK, and therefore had a pulse-width between the time $T_0$ and $T_1$, as can be the case in a typical clock receiver system, the receiver logic of a typical clock receiver could fail to identify the initial pulse. However, in the example of FIG. 2, at a time $T_2$, the scan clock signal S_CLK is de-asserted from the logic-high state back to the logic-low state. Therefore, the first preliminary pulse 202 is de-asserted at a pulse width corresponding to approximately twice the pulse width of the high-speed clock signal HS_CLK. Accordingly, the first preliminary pulse 202 corresponding to the initial pulse of the scan clock signal S_CLK achieves a sufficient amplitude to ensure detection by the receiver logic 104.

At a time $T_3$, the scan clock signal S_CLK is again asserted from the logic-low to the logic-high state corresponding to a rising-edge of a second preliminary pulse, demonstrated at 206. The timing diagram 200 again demonstrates the effect of the distortion that can occur in the scan clock signal S_CLK. However, the distortion is less pronounced in the second preliminary pulse 206 of the pulse sequence, as the fabrication materials settle in response to the potential changes of the activation and deactivation of the associated transistor devices. At a time $T_4$, the scan clock signal S_CLK is de-asserted from the logic-high state back to the logic-low state. Therefore, the second preliminary pulse 206 is de-asserted at a pulse width corresponding to approximately one and one-half the pulse width of the high-speed clock signal HS_CLK. Accordingly, the second preliminary pulse 206 likewise achieves a sufficient amplitude to ensure detection by the receiver logic 104.

At a time $T_5$, the scan clock signal S_CLK is again asserted from the logic-low to the logic-high state corresponding to a rising-edge of a first periodic pulse, demonstrated at 208. As an example, the first periodic pulse 208 can correspond to a launch pulse of a LOC TFT. The timing diagram 200 again demonstrates the effect of the distortion that can occur in the scan clock signal S_CLK. However, the distortion is less pronounced in the first periodic pulse 208 than in the second preliminary pulse 206 of the pulse sequence, as the fabrication materials settle in response to the potential changes of the activation and deactivation of the associated transistor devices. At a time $T_6$, the scan clock signal S_CLK is de-asserted from the logic-high state back to the logic-low state. As an example, the pulse width between the times $T_5$ and $T_6$ can correspond to a pulse width of a single cycle of the high-speed clock signal HS_CLK. Therefore, each of the logic-low to logic-high transition at the time $T_5$ and the logic-high to logic-low transition at the time $T_6$ is intended to be detected by the receiver logic 104 to detect the first periodic pulse 208 as part of the TFT.

Similarly, at a time $T_7$, the scan clock signal S_CLK is again asserted from the logic-low to the logic-high state corresponding to a rising-edge of a second periodic pulse, demonstrated at 210. As an example, the second periodic pulse 210 can correspond to a capture pulse of a LOC TFT. The timing diagram 200 demonstrates that there is substantially no distortion in the scan clock signal S_CLK in generating the second periodic pulse, such as based on the fabrication materials having settled in response to the potential changes of the activation and deactivation of the associated transistor devices. At a time $T_8$, the scan clock signal S_CLK is de-asserted from the logic-high state back to the logic-low state. As an example, the pulse width between the times $T_7$ and $T_8$ can correspond to a pulse width of a single cycle of the high-speed clock signal HS_CLK. Therefore, each of the logic-low to logic-high transition at the time $T_7$ and the logic-high to logic-low transition at the time $T_8$ is intended to be detected by the receiver logic 104 to detect the second periodic pulse 210 as part of the TFT.

While the first and second preliminary pulses 202 and 206 are demonstrated as approximately twice and one and one-half times the pulse width of the first and second periodic pulses 208 and 210, respectively, it is to be understood that other pulse-widths and arrangements of the first and second preliminary pulses 202 and 206 can be provided as described herein. For example, the scan clock signal S_CLK can include only a single preliminary pulse, or can include more than two preliminary pulses 202 and 206. As another example, the first and second preliminary pulses 202 and 206 can have equal pulse widths, and can have pulse-widths that are longer than twice the and one and one-half times the pulse width of the first and second periodic pulses 208 and 210, respectively. Accordingly, other arrangements of the preliminary pulses 202 and 206 are possible as described herein.

Figure 3:
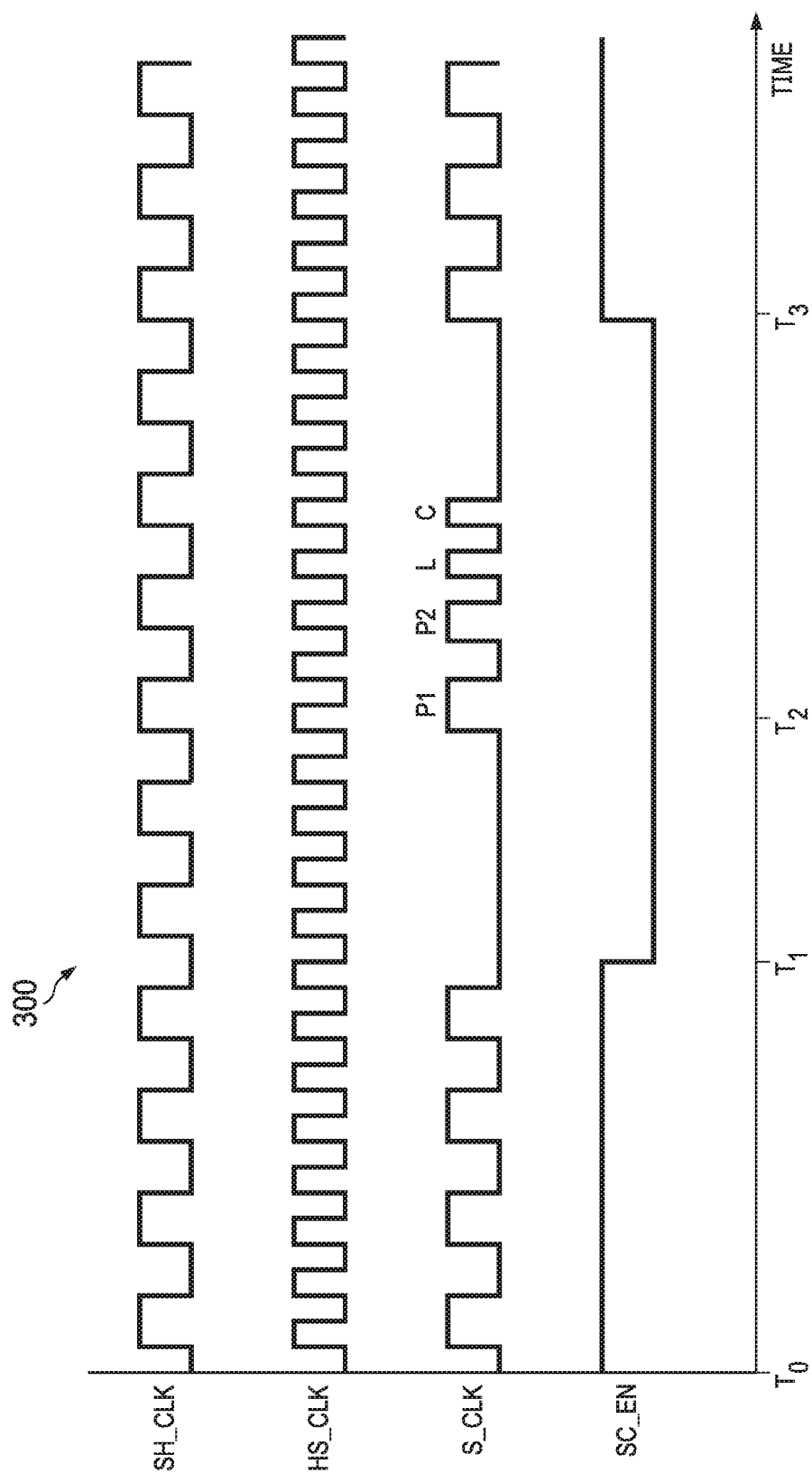
FIG. 3 illustrates another example of a timing diagram.

FIG. 3 illustrates an example of a timing diagram 300. The timing diagram 300 includes the shift clock signal SH_CLK, the high-speed clock signal HS_CLK, the scan clock signal S_CLK, and the scan enable signal SC_EN all plotted as a function of time. The shift clock signal SH_CLK, the high-speed clock signal HS_CLK, the scan clock signal S_CLK, and the scan enable signal SC_EN can each correspond to the shift clock signal SH_CLK, the high-speed clock signal HS_CLK, the scan clock signal S_CLK, and the scan enable signal SC_EN in the example of FIG. 1. Therefore, reference is to be made to the example of FIG. 1 in the following description of the example of FIG. 3.

The timing diagram 300 demonstrates that the shift clock signal SH_CLK and the high-speed clock HS_CLK oscillate periodically, with the shift clock SH_CLK having a pulse-width that is approximately twice a pulse-width of the high-speed clock HS_CLK. At a time $T_0$, the scan enable signal SC_EN begins at a logic-high state. Therefore, at the time $T_0$, the scan clock signal S_CLK is provided as a periodic signal having a frequency and period that are approximately the same as the shift clock signal SH_CLK. As an example, the associated circuit can be operating in a shift-in mode at the time $T_0$. For example, the scan clock generator 102 can include a multiplexer that can provide the scan clock signal S_CLK as the shift clock signal SH_CLK based on a given logic-state of the scan enable signal SC_EN (e.g., the logic-high state of the scan enable signal SC_EN).

At a time $T_1$, the scan enable signal SC_EN is de-asserted to a logic-low state to switch from the shift-in mode to a capture window of the TFT. In response to de-assertion of the scan enable signal SC_EN, the scan clock signal S_CLK is provided at a logic-low state corresponding to a dead time (e.g., dead cycles). For example, the multiplexer of the scan clock generator 102 can switch the input based on the change of logic-state of the scan enable signal SC_EN to provide the scan clock signal S_CLK as the dead cycles beginning at the time $T_1$. As an example, the scan clock generator 102 can include a delay element to define a duration of time of the dead time (e.g., between the times $T_1$ and $T_2$). At a time $T_2$, the scan clock signal S_CLK is provided as a sequence of pulses. In the example of FIG. 3, the sequence of pulses includes a first preliminary pulse labeled as "P1", a second preliminary pulse labeled as "P2" that follows the first preliminary pulse P1, a launch pulse "L" that follows the second preliminary pulse P2, and a capture pulse "C" that follows the launch pulse L.

The first preliminary pulse P1 and the second preliminary pulse P2 can correspond to the first and second preliminary pulses 202 and 206, respectively, in the example of FIG. 2. However, the first and second preliminary pulses P1 and P2 are demonstrated as ideal pulses (e.g., without distortion) in the example of FIG. 3. It is to be understood however that the first and second preliminary pulses P1 and P2 can each exhibit distortion, similar to as described in the example of FIG. 2. In the example of FIG. 3, the first preliminary pulse P1 has a pulse-width that is approximately twice a pulse width of the high-speed clock HS_CLK and the second preliminary pulse P2 has a pulse-width that is approximately one and one-half times the pulse-width if the high-speed clock HS_CLK. Therefore, the first and second preliminary pulses P1 and P2 can have pulse-widths that are sufficiently long to facilitate detection by the receiver logic 104 even when exhibiting distortion. Therefore, similar to as described previously, the receiver logic 104 can be programmed to detect each of the first and second preliminary pulses P1 and P2, as well as each of the launch and capture pulses L and C, to pass the TFT.

At a time $T_3$, after conclusion of the sequence of pulses, the scan clock signal S_CLK is once again provided as a logic-low signal (e.g., a dead time) for the conclusion of the capture window. At a time $T_4$, the scan enable signal SC_EN is asserted from the logic-low state to the logic-high state to conclude the capture window, which therefore is defined by the times $T_1$ through $T_4$. Therefore, beginning at the time $T_4$, the associated circuit can return to the shift-in mode in which the scan clock signal S_CLK is once again provided as periodic pulses substantially similar to the shift clock signal SH_CLK.

Figure 4:
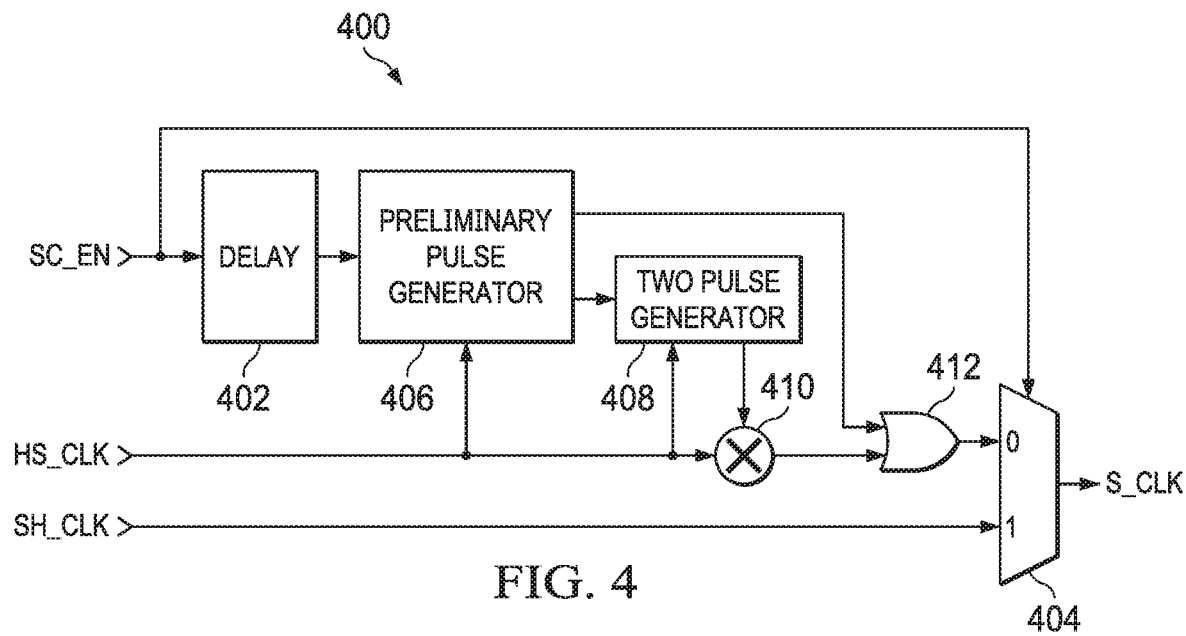
FIG. 4 illustrates an example of a scan clock generator.

FIG. 4 illustrates an example of a scan clock generator 400. The scan clock generator 400 can correspond to the scan clock generator 102 in the example of FIG. 1. Therefore, reference is to be made to the examples of FIGS. 1-3 in the following description of the example of FIG. 1.

The scan clock generator 400 receives the shift clock signal SH_CLK, the high-speed clock signal HS_CLK, and the scan enable signal SC_EN. The scan enable signal SC_EN is provided to both a delay element 402 and a multiplexer 404. The delay element 402 is configured to delay a logic-state transition of the scan enable signal SC_EN. As an example, the delay element 402 can define a duration of the dead time in the capture window, similar to as described previously in the example of FIG. 3. The multiplexer 404 receives the shift-clock signal SH_CLK as an input (e.g., on the logic-1 input), and is therefore configured to provide the shift clock signal SH_CLK as the scan clock signal S_CLK at an output in response to a first logic state of the scan enable signal SC_EN (e.g., a logic-high state of the scan enable signal SC_EN during normal operation of the associated circuit).

The delay element 402 provides a delay signal D_SC, corresponding to a delayed version of the scan enable signal SC_EN, to a preliminary pulse generator 406 configured to generate the at least one preliminary pulse (e.g., the preliminary pulses P1 and P2), demonstrated in the example of FIG. 4 as a signal "PP". Therefore, the change of logic-state of the delay signal D_SC can define a rising-edge of the first preliminary pulse, such that the delay element 402 defines the duration of the dead time that precedes the sequence of pulses in the capture window during the TFT. The preliminary pulse generator 406 also receives the high-speed clock signal HS_CLK as an input, such that the preliminary pulse generator 406 can generate the at least one preliminary pulse (e.g., the preliminary pulses P1 and P2) based on a predetermined number of cycles of the high-speed clock signal HS_CLK. For example, the preliminary pulse generator 406 can be programmed to define the pulse-width of each of the preliminary pulse(s) (e.g., the first and second preliminary pulses P1 and P2), as well as the time between the preliminary pulse(s), based on a quantity of pulse-widths of the high-speed clock signal HS_CLK.

The preliminary pulse generator 406 also provides a trigger signal "TRG" to a two-pulse generator 408. As an example, the trigger signal TRG can be asserted subsequent to the last of the preliminary pulse(s) PP, such that the two-pulse generator 408 can generate the launch and capture pulses L and C in response to the trigger signal TRG. In the example of FIG. 4, the two-pulse generator 408 can also receive the high-speed clock signal HS_CLK as an input, such that the two pulse generator 408 can generate a gating pulse GP at a rising edge of the high-speed clock signal HS_CLK. As an example, the gating pulse GP can have a pulse-width that corresponds to three pulse-widths of the high-speed clock signal HS_CLK. The gating pulse GP is provided to a gating element 410 that also receives the high-speed clock signal HS_CLK as an input. For example, the gating element 410 can be configured as a logic-AND gate. Therefore, the gating element 410 can provide the launch pulse L and the capture pulse C, demonstrated in the example of FIG. 4 collectively as a signal "LC", as an output in response to receiving the gating pulse GP.

In the example of FIG. 4, the scan clock generator 400 also includes a logic-OR gate 412 that is configured to provide a logic-OR operation of the preliminary pulses PP and the launch and capture pulses LC to provide the pulse sequence "PS" at an output. The pulse sequence PS is provided to the multiplexor 404 as a second input (e.g., on the logic-0 input). Therefore, when the scan enable signal SC_EN is in the second logic state corresponding to the capture window (e.g., the logic-low state during a TFT), the multiplexor 404 provides the pulse sequence PS as the scan clock signal S_CLK. Accordingly, the scan clock signal S_CLK is provided from the multiplexor 404 as the shift clock signal SH_CLK in a first state of the scan enable signal SC_EN (e.g., during normal operation of the associated circuit), and is provided from the multiplexor 404 as the pulse sequence PS in a second state of the scan enable signal SC_EN (e.g., during the capture window). Accordingly, the receiver logic 104, in response to the second state of the scan enable signal SC_EN, is configured to identify the pulse sequence PC (e.g., including the preliminary pulses P1 and P2 and the launch and capture pulses L and C) during the capture window defined by the scan enable signal SC_EN to pass the TFT. As a result, based on the longer pulse-widths of the preliminary pulse(s) PP, the distortion of the scan clock signal S_CLK, as experienced by the receiver logic 104, can settle before the receiver logic 104 can identify the logic transitions of the launch and capture pulses L and C to sufficiently identify transitions of the high-speed clock signal HS_CLK during normal operation of the associated circuit.

Figure 5:
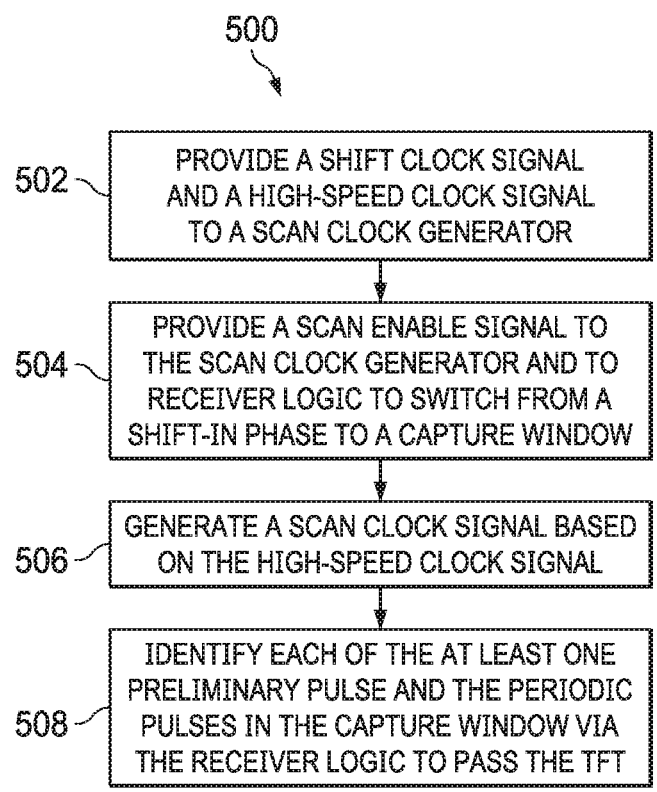
FIG. 5 illustrates an example of a method for performing an LOC TFT.

In view of the foregoing structural and functional features described above, a methodology in accordance with various aspects of the disclosure will be better appreciated with reference to FIG. 5. FIG. 5 illustrates an example of a method 500 for performing an LOC TFT. It is to be understood and appreciated that the method of FIG. 5 is not limited by the illustrated order, as some aspects could, in accordance with the present disclosure, occur in different orders and/or concurrently with other aspects from that shown and described herein. Moreover, not all illustrated features may be required to implement a methodology in accordance with an aspect of the present examples.

At 502, a shift clock signal (e.g., the shift clock signal SH_CLK) and a high-speed clock signal (e.g., the high-speed clock signal HS_CLK) are provided to a scan clock generator (e.g., the scan clock generator 102). At 504, a scan enable signal (e.g., the scan enable signal SC_EN) is provided to the scan clock generator and to receiver logic (e.g., the receiver logic 104) to switch from a shift-in phase (e.g., from the time $T_0$ to the time $T_1$ in the example of FIG. 3) to a capture window (e.g., from the time $T_1$ to the time $T_4$ in the example of FIG. 3). At 506, a scan clock signal (e.g., the scan clock signal S_CLK) is generated based on the high-speed clock signal. The scan clock signal includes a pulse sequence (e.g., the pulse sequence PS) comprising at least one preliminary pulse (e.g., the preliminary pulse(s) PP) followed by a plurality of periodic pulses (e.g., the launch and capture pulses LC) in the capture window. At 508, each of the at least one preliminary pulse and the periodic pulses are identified in the capture window via the receiver logic to pass the TFT.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A clock receiver system comprising:
    a scan clock generator configured to receive a shift clock signal and a high-speed clock signal and to generate a scan clock signal for a transition fault test (TFT) based on the high-speed clock signal, the scan clock generator providing the scan clock signal as having a pulse sequence comprising at least one preliminary pulse followed by periodic logic state transitions in a capture window during the TFT; and
    receiver logic configured to receive the scan clock signal and being programmed to identify each of the at least one preliminary pulse and the periodic logic state transitions in the capture window to pass the TFT.

2. The system of claim 1, wherein the periodic logic state transitions corresponds to a plurality of periodic pulses, each of the at least one preliminary pulse comprises a pulse width that is greater than a pulse width of each of the periodic pulses.

3. The system of claim 2, wherein the at least one preliminary pulse comprises:
    a first pulse having a pulse width that is at least twice the pulse width of each of the periodic pulses; and
    a second pulse having a pulse width that is greater than the pulse width of each of the periodic pulses.

4. The system of claim 1, wherein the TFT is a launch off capture (LOC) TFT, such that the periodic logic state transitions correspond to a launch pulse and a capture pulse each having a pulse width that is approximately equal to a pulse width of the high-speed clock signal.

5. The system of claim 1, wherein the scan clock generator comprises:
    at least one pulse generator configured to generate the at least one preliminary pulse based on the high-speed clock signal; and
    clock combination logic configured to combine the at least one preliminary pulse and the periodic logic state transitions to generate the pulse sequence.

6. The system of claim 5, further comprising a multiplexer configured to provide the scan clock signal as one of the pulse sequence and the shift clock signal in response to a scan enable signal.

7. The system of claim 6, wherein the at least one pulse generator comprises a preliminary pulse generator configured to generate the at least one preliminary pulse based on a predetermined quantity of pulse widths of the high-speed clock signal and to generate the scan enable signal in response to generating the at least one preliminary pulse, the scan clock generator further comprising a clock gating component configured to generate the periodic logic state transitions from the high-speed clock signal in response to the scan enable signal.

8. The system of claim 7, wherein the at least one pulse generator comprises a second pulse generator configured to provide a gating pulse to the clock gating component for generating the periodic logic state transitions, the gating pulse having a pulse width corresponding to approximately three pulse-widths of the high-speed clock signal to provide the periodic logic state transitions and a de-assertion time between the periodic logic state transitions that are each equal to a pulse width of the high-speed clock signal.

9. The system of claim 7, further comprising a delay element configured to receive the scan enable signal and to provide an activation signal to the preliminary pulse generator after a delay of a state transition of the scan enable signal, wherein the delay defines a dead time before the at least one preliminary pulse in the capture window.

10. An integrated circuit (IC) chip comprising the clock receiver system of claim 1.

11. A method for performing a launch off capture (LOC) transition fault test (TFT), the method comprising:
    providing a shift clock signal and a high-speed clock signal to a scan clock generator;
    providing a scan enable signal to the scan clock generator and to receiver logic to switch from a shift-in phase to a capture window;
    generating a scan clock signal based on the high-speed clock signal, the scan clock signal comprising a pulse sequence comprising at least one preliminary pulse followed by a plurality of periodic pulses in the capture window; and
    identifying each of the at least one preliminary pulse and the periodic pulses in the capture window via the receiver logic to pass the TFT.

12. The method of claim 11, wherein generating the scan clock signal comprises:
    generating a first pulse having a pulse width that is twice the pulse width of each of the periodic pulses; and
    generating a second pulse having a pulse width that is greater than the pulse width of each of the periodic pulses.

13. The method of claim 11, wherein generating the scan clock signal comprises:
    generating the at least one preliminary pulse based on the high-speed clock signal; and
    combining the at least one preliminary pulse and the periodic pulses via logic; and
    multiplexing between the pulse sequence and the shift clock signal in response to a scan enable logic signal to generate the scan clock signal.

14. The method of claim 11, wherein generating the scan clock signal comprises:
    providing a gating pulse to a clock gating component in response to the scan enable signal, the gating pulse having a pulse width corresponding to approximately three pulse-widths of the high-speed clock signal; and generating the periodic pulses from the clock gating component to provide the periodic pulses and a de-assertion time between the periodic pulses to each be approximately equal to a pulse width of the high-speed clock signal.

15. The method of claim 11, further comprising:

delaying a logic state transition of the scan enable signal by a predetermined duration via a delay element;

defining a dead time in the capture window based on the predetermined duration; and generating the at least one preliminary pulse upon expiration of the predetermined duration.

16. An integrated circuit (IC) chip comprising a clock receiver system, the system comprising:

a scan clock generator configured to receive a shift clock signal and a high-speed clock signal and to generate a scan clock signal for a launch off capture (LOC) transition fault test (TFT) based on the high-speed clock signal, the scan clock generator providing the scan clock signal as having a pulse sequence comprising at least one preliminary pulse followed by periodic pulses in a capture window during the TFT, each of the at least one preliminary pulse comprising a pulse width that is greater than a pulse width of each of the periodic pulses; and receiver logic configured to receive the scan clock signal and being programmed to identify each of the at least one preliminary pulse and the periodic pulses in the capture window to pass the TFT.

17. The system of claim 16, wherein the at least one preliminary pulse comprises:

a first pulse having a pulse width that is twice the pulse width of each of the periodic pulses; and a second pulse having a pulse width that is greater than the pulse width of each of the periodic pulses.

18. The system of claim 16, wherein the scan clock generator comprises:

at least one pulse generator configured to generate the at least one preliminary pulse based on the high-speed clock signal; and clock combination logic configured to combine the at least one preliminary pulse and the periodic pulses to generate the pulse sequence; and a multiplexer configured to provide the scan clock signal as one of the pulse sequence and the shift clock signal in response to a scan enable signal.

19. The system of claim 18, wherein the at least one pulse generator comprises a preliminary pulse generator configured to generate the at least one preliminary pulse based on a predetermined quantity of pulse widths of the high-speed clock signal and to generate the scan enable signal in response to generating the at least one preliminary pulse, the scan clock generator further comprising a clock gating component configured to generate the periodic pulses from the high-speed clock signal in response to the scan enable signal.

20. The system of claim 19, further comprising a delay element configured to receive the scan enable signal and to provide an activation signal to the preliminary pulse generator after a delay of a state transition of the scan enable signal, wherein the delay defines a dead time before the at least one preliminary pulse in the capture window.

* * * * *